United States Patent
Chidambarrao et al.

(10) Patent No.: US 6,573,561 B1
(45) Date of Patent: Jun. 3, 2003

(54) VERTICAL MOSFET WITH ASYMMETRICALLY GRADED CHANNEL DOPING

(75) Inventors: Dureseti Chidambarrao, Weston, CT (US); Ramachandra Divakaruni, Ossining, NY (US); Jack A. Mandelman, Stormville, NY (US); Kevin McStay, Hopewell Junction, NY (US)

(73) Assignees: International Business Machines Corporation, Armonk, NY (US); Infineon Technologies AG, Munich (DE)

(*) Notice: Subject to any disclaimer, the term of this patent is extended or adjusted under 35 U.S.C. 154(b) by 0 days.

(21) Appl. No.: 10/096,192

(22) Filed: Mar. 11, 2002

(51) Int. Cl.[7] .................. H01L 29/76; H01L 29/94; H01L 31/062; H01L 31/113; H01L 31/119
(52) U.S. Cl. ............... 257/335; 257/301; 257/304; 257/328; 257/329; 257/336
(58) Field of Search ................ 257/328, 329, 257/335, 336

(56) References Cited

U.S. PATENT DOCUMENTS 4,967,248 A * 10/1990 Shimizu ............... 357/23.6
5,637,898 A * 6/1997 Baliga .................. 257/330
6,285,060 B1 * 9/2001 Korec et al. ........... 257/342

OTHER PUBLICATIONS

Array Pass Transistor Design in Trench Cell for Gbit DRAM and Beyond Li, et al. VLSI Tech Sys. App. 1999, p. 251.

A Novel Trench DRAM Cell with a Verified Access Transistor and Buried Strap for 4Gb/16Gb, Gruening, et al. IEDM 1999 p. 25.

An Orthogonal 6F+e,cir +ee 2 Trench Sidewall Vertical Device Cell for 4Gb/16Gb DRAM Radens, et al. IEDM 2000, p. 349.

* cited by examiner

*Primary Examiner*—Eddie Lee
*Assistant Examiner*—Jesse A. Fenty
(74) *Attorney, Agent, or Firm*—Eric W. Petraske

(57) ABSTRACT

Short channel effects in vertical MOSFET transistors are considerably reduced, junction leakage in DRAM cells is reduced and other device parameters are unaffected in a transistor having a vertically asymmetric threshold implant. A preferred embodiment has the peak of the threshold implant moved from the conventional location of midway between source and drain to a point no more than one third of the channel length below the bottom of the source.

8 Claims, 3 Drawing Sheets

US 6,573,561 B1

VERTICAL MOSFET WITH ASYMMETRICALLY GRADED CHANNEL DOPING

FIELD OF THE INVENTION

The field of the invention is the formation of vertical transistors in integrated circuit processing.

BACKGROUND OF THE INVENTION

The vertical MOSFET device is advantageous for DRAM scaling (see Li et al, Int. Symp. VLSI Tech. Sys. App. 1999, p251; Radens et al, IEDM 2000, p.349; Gruening et al, IEDM 1999, p.25), since it maintains a desired array MOSFET channel length which is independent of the minimum lithographic feature size elsewhere on the chip. This results in properly scaled array MOSFETs for minimum lithographic feature sizes below 140 nm, which would be unattainable with DRAM arrays employing planar array MOSFETs. The longer channel length of the vertical MOSFET is decoupled from the minimum lithographic feature size, thus not impacting overall density.

Referring now to FIG. 1, there is shown a portion of an integrated circuit containing two DRAM cells 80 formed in silicon substrate 10 and disposed on the left and right of the Figure, each cell including a vertical transistor 100 and a deep trench capacitor 30. A problem known to the art is that the channel length Leff (distance between the drain (node diffusion) 107 and source (bit-line diffusion) 130 (denoted with bracket 134 on the left of the Figure) of the vertical transistor 100 can vary because of fluctuations in the recess etch that opens the aperture that will hold the transistor. Under certain circuit conditions, the transistor will operate such that the source and drain electrodes are switched.

The device recess depth, L-mech, denoted by bracket 136 on the right of the Figure, is defined structurally from scanning electron micrographs (SEM) as the distance from the silicon surface 12 to the bottom of the trench top oxide (TTO) 110 as seen in FIG. 1. TTO 110 rests on the top of the doped polysilicon 105 that forms the buried strap connecting the drain 107 with the center electrode of the capacitor. Buried strap 105 rests on the top of trench collar 20 that is defined in a timed etch.

In the prior art, the energy of the threshold implant was set such that the concentration peak was midway between source 130 and drain 107, indicated in the Figure by dashed line 150. Inevitable fluctuations in the device recess L-mech results in variations of the channel length, thus causing variations in electrical characteristics due to the short channel effects (SCE) in the vertical device. If L-mech gets smaller, Leff 134 of transistor 100 gets smaller, resulting, as those skilled in the art will be aware, in loss of Vt control.

It would be highly advantageous to find a way to design the vertical device such that the fluctuating mechanical length of the channel (the recess control) is not a critical issue for SCE.

SUMMARY OF THE INVENTION

The invention relates to vertical transistors having a structured threshold implant that desensitizes the SCE with respect to fluctuations in the mechanical channel length.

A feature of the invention is the placement of the peak of a Vt implant to one side of the geometric center of the channel and closer to the source (bitline diffusion) than to the drain (node diffusion).

Another feature of the invention is an increase in the dose of the threshold implant to compensate for the boron loss into the bitline diffusion that happens because of the As field effect.

Another feature of the invention is reduced junction leakage when the drain (node diffusion) is maintained at a logic high level.

DESCRIPTION OF THE PREFERRED EMBODIMENT

Figure 1:
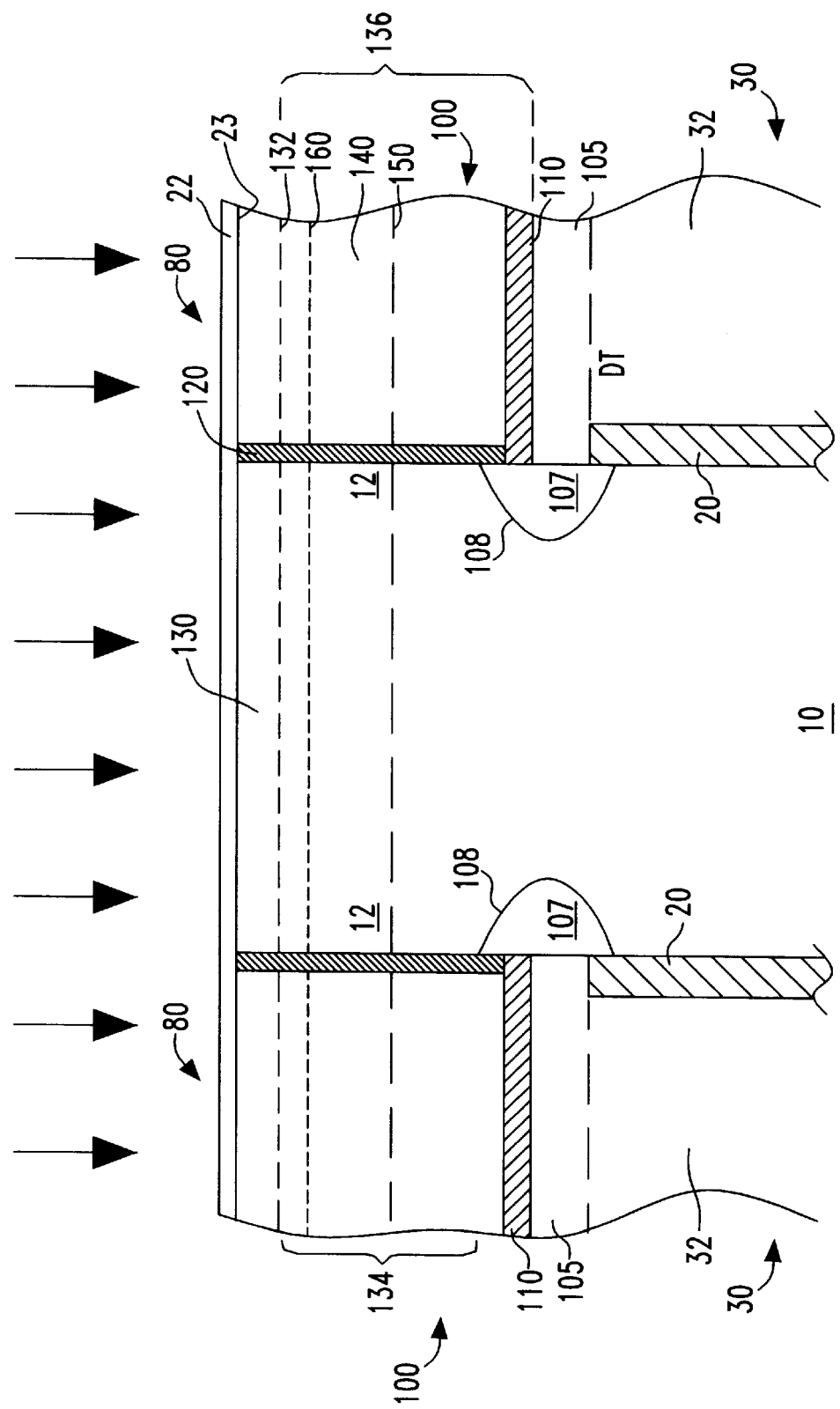
FIG. 1 shows, in partially pictorial, partially schematic form, a vertical transistor according to the invention.

The following uses a vertical transistor that is part of a DRAM cell as an example, but that configuration is not required for the broadest use of the invention, which can be applied in a number of different circuits.

Referring again to FIG. 1, a pair of N-channel transistors 100 are contained within a pair of DRAM cells 80 on the left and right of the Figure and separated by a portion of p-type single-crystal silicon 10. Deep trench capacitors 30 complete the cells. Structurally, the transistor components are the source (upper electrode) 130 (the As-doped bitline diffusion of the DRAM array extending perpendicular to the plane of the paper through the active area in width), polysilicon gate 140, with gate dielectric 120 separating the vertical gate 140 from the bulk silicon transistor body 10 and drain (lower electrode—the As-doped buried strap outdiffusion extending perpendicular to the plane of the paper through the active area in width) 107. Pad layer 22 (oxide SiO2 and/or nitride Si3N4) protects the silicon surface during these preliminary steps. Under certain circuit conditions the transistor will operate such that the source and drain electrodes are switched. Lower electrode 107, doped N$^+$ and formed by diffusion of As dopant out from a buried strap layer of doped poly 105 provides a path for electrons to follow through buried strap 105 and into the center electrode 32 of deep trench capacitor 30. A layer of dielectric 110, referred to as trench top oxide, separates gate 140 from buried strap 105. The TTO is formed by depositing high-density-plasma (HDP) oxide that forms predominantly on planar surfaces. The small sidewall HDP oxide thickness is readily etched leaving behind HDP oxide only on the deep trench poly 105. In operation, electrons will flow from upper electrode 130 along a channel denoted with numeral 12 in the transistor body region opposite gate 140 into lower electrode 107. Illustratively, the vertical channel has a length of about 150–200 nm in current technology. For purposes of the attached claims, gate 140 and the body will be referred to as being above lower electrode 107, since they are closer to the substrate surface and part of the transistor. In an actual DRAM circuit, there will be a set of cells, having a set of transistors and a set of capacitors.

Fluctuations in the channel length will affect the threshold voltage of transistors 100 which will, in turn, affect the amount of charge that is stored in individual cells. In addition, formation of lower electrode 107 by outdiffusion from buried strap 105 does not permit the control of dopant gradient to form a low-doped drain with the same degree of precision that has been developed for horizontal planar transistors.

The inventors have found unexpectedly that it is possible to desensitize short-channel effects in the transistor to fluctuations in the channel length and at the same time reduce junction leakage at the lower electrode by changing the implant that sets the threshold voltage of the transistors. In the prior art, the implant energy was selected to position the peak of the ion distribution about midway in the channel (equidistant from upper electrode and lower electrode, denoted by dashed line 150). The inventors have found that it is desirable to vertically grade the channel doping of vertical MOSFETs such that the peak of the threshold implant concentration is moved upward toward the silicon surface and so that ion channel doping in the vicinity of upper electrode 130 is higher than in the prior art and the doping concentration near lower electrode diffusion 107 is reduced compared to that in the prior art.

Using a separate, shallower Vt tailoring implant allows the implant near the N bitline diffusion 130 to set the concentration at the peak as needed to control the threshold voltage. The peak of the ion distribution being shifted upward, the tail in the vicinity of the buried strap consequently has a lower concentration than in the prior art, so that hot-electron effects are reduced and an additional degree of freedom to establish the equivalent of a LDD area at the lower electrode has been provided by the invention.

The channel doping in the prior art placed the peak of the implant that determines the threshold voltage (Vt) of the device midway between upper electrode and lower electrode. While that approach could produce a device with a centered implant that has the correct Vt of about 950–1000 mV for a nominal channel length, the typical roll-off curve of the device showed too much SCE. In the preferred embodiment we describe the solution of making the device asymmetric to improve the roll-off. Use of the asymmetric channel doping profile in a vertical MOSFET is an unexpected result that was discovered through the use of device simulation and confirmed by experiment.

Preferred Embodiment

Transistors constructed according to the invention control short channel effects while preserving the other critical device characteristics (i.e. constrained doping at the buried strap diffusion, sub-Vt swing, lower electrode induced barrier lowering (DIBL) and back-bias sensitivity (the change in threshold voltage when the substrate bias is changed from −0.5V to −2V, for example). The solution involves reducing the depth of the Vt implant, such that its peak (denoted by dotted line 160 in FIG. 1) lies no deeper relative to the bitline-channel junction (point 332 in FIG. 3) than one-third the distance from that junction to the channel-lower electrode junction (point 308 in FIG. 3); i.e. L(132–160)/LEff<⅓. Distances in this description and in the claims are taken from the point at which the electrode ion concentration equals the threshold implant concentration (points 332 and 308 in FIG. 3). Points 332 and 308 in FIG. 3 correspond to lines 132 and 108 in FIG. 1. In a particular design for a DRAM having a minimum ground rule of about 110 nm the energy of the Vt tailor implant was reduced from 75 keV, peaking at 0.24 μm, to 35–40 keV, peaking at 0.12 μm (which places the peak slightly below the junction edge 132 of diffusion 130). The dose also was increased (from 1.1× $10^{13}$/cm² to $1.3^{13}$/cm²) to compensate for the dopant field effects of the As implant. Unexpectedly, the SCE are much improved from this change in the depth of the Vt tailor implant. The asymmetry of the channel profile allows control of the Vt to be partially decoupled from the sensitivity to recess etch control, since the shallow Vt tailor implant significantly reduces the short channel effects. The recess L-mech variation impacts only the low boron doping region of the channel near the strap and thus does not affect the overall Vt by very much. The value of Vt is primarily determined by the bulk of the ion distribution at the upper end of the channel. The results shown below clearly indicate that the solution is quite effective and that roll-off is significantly improved. Not only that, this is accomplished while preserving all the other important device characteristics. In addition to the improvement in Vt control due to reduction of SCE, back-bias sensitivity (the change in threshold voltage when the P-well bias is changed (from −0.5V to −2V, for example)) is reduced. For generalized vertical MOSFETs, such an asymmetric channel doping provides for reduced hot-electron effects when operated with the bottom diffusion as the drain.

Figure 2:
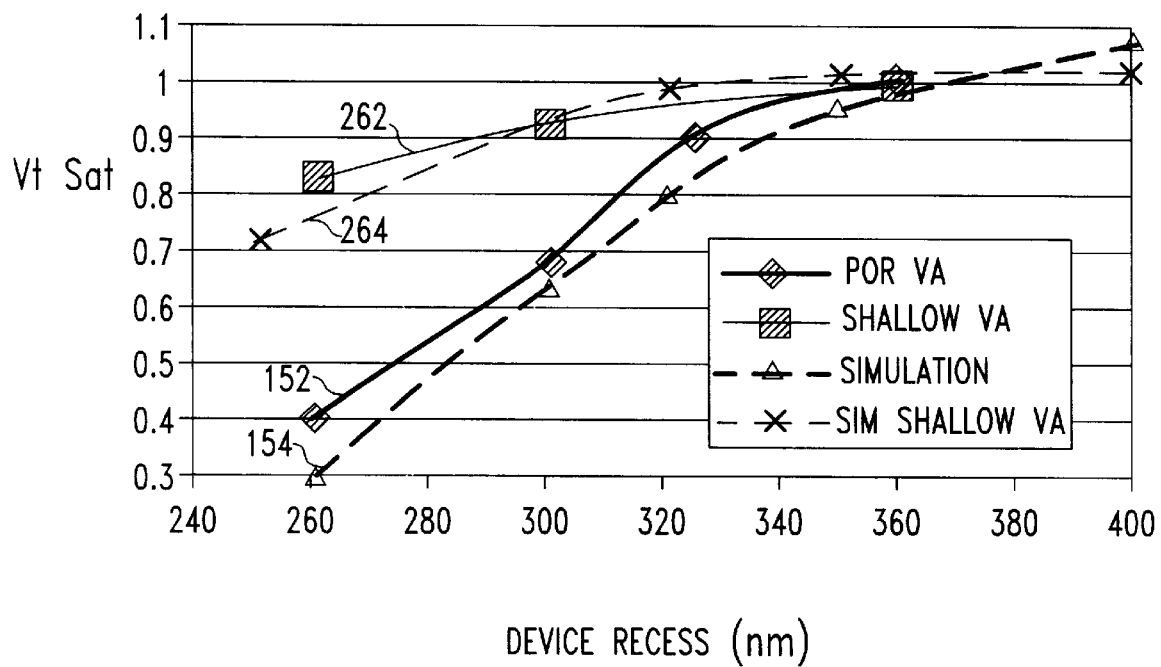
FIG. 2 shows curves illustrating rolloff of Vt as a function of device recess depth according to the prior art and according to the invention.

We first describe the problem of the short channel effects in the 110 nm technology generation vertical device. Simulation was used for a detailed and in-depth understanding of the sensitivity of the device characteristics to L-mech recess control. The effects of changing various process parameters such as implants (energy and dose), including wells and node diffusion, various anneal temperatures and times, charge states, polysilicon and gate doping, buried strap out-diffusion, etc. were studied. While one major focus was controlling roll-off, all the other device parameters also had to be examined. Unexpectedly, one parameter had the largest impact on roll-off and preserved other device characteristics—the threshold implant energy that tailored the device Vt. In FIG. 2 the dashed line 154 through the triangles shows the simulated roll-off curve for the 75 keV implant case (conventional process). The experiments are the diamonds and fall on the simulation predictions very well. This roll-off is a cause for concern, since the device recess (L-mech) variation is typically 350 nm+/−50 nm and could be even larger from lot to lot. Therefore, down to L-mech of 250–300 nm, the Vt can be off by between about 600 mV and 300 mV from the value needed to meet the off-current objective.

The predicted effect of the shallow threshold implant is also shown in FIG. 2 as the solid curve 262 through the squares. It is clear that the simulations predict a remarkable improvement in roll-off (curves 262 and 264 compared with 152 and 154). To verify this prediction, we ran wafers with a shallow implant energy of 35 keV. As can be seen in FIG. 2. the experimental results came quite close to the predicted simulation results for the shallow Vt implant case. As can readily be seen from the Figure, the roll-off improved tremendously for the shallow implant energy.

Figure 3:
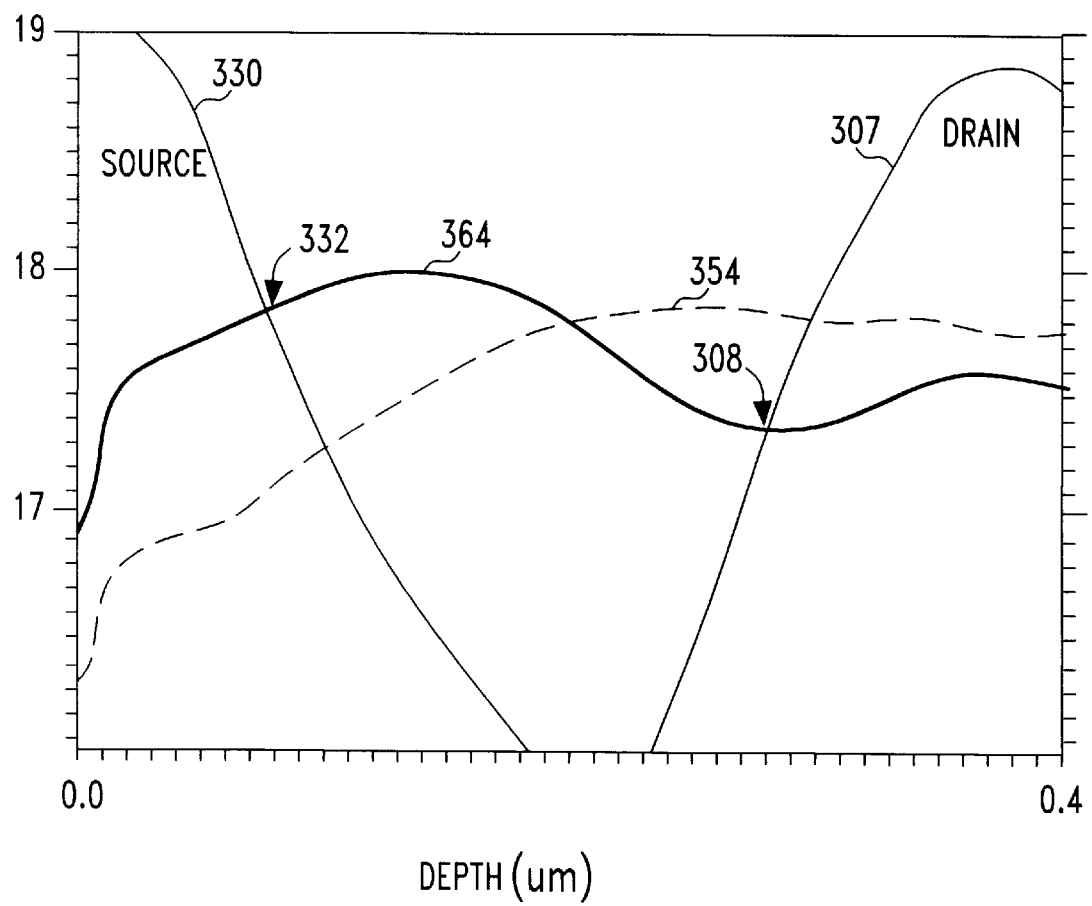
FIG. 3 shows curves illustrating the ion concentration of the threshold implant (and other needed P-well implants) as a function of depth below the silicon surface.

The simulated doping profiles (concentration as a function of depth) for the two energies are shown in FIG. 3. The position of the peak shifted from 0.24 μm for the prior art method (curve 354) to about 0.12 μm for an implant according to the invention (curve 364). This allows the device recess (which has its nominal depth at 0.35 μm) some room to fluctuate without impacting the high Vt region of the profile. The primary embodiment changes the energy of the Vt implant from 75 eV to 35–40 keV. This changes the peak of the channel dopant from the middle of the vertical gate to within a third of the gate length from the channel-bit-line junction. The ion concentration near lower electrode 307 is significantly less than at the peak, reducing leakage at that junction. The rise of curve 364 within lower electrode 307 does not matter because it is outside the channel. Another significant benefit of the decoupling of the Vt tailor implant from the other P-well implants (for controlling the vertical parasitic effects between the strap and the buried plate) is that near the storage node the concentration is reduced significantly so that the node leakage is reduced. Independent optimization of the device performance, retention performance, and vertical parasitic effect control can be readily achieved. Of course, roll-off is not the only device characteristic of importance. We examined and showed experimentally that the effects of the change in implant energy on Ids, write-back, DIBL,and Sub-Vt slope were minimal. The Ids and DIBL were very slightly worse, the Sub-Vt slope is better, and the write-back did not change.

Embodiment 1

In this preferred embodiment the shallow bitline implant is done at the same time as the rest of the p-well implants (primarily for controlling the vertical parasitic effects between the buried strap outdiffusion and the buried plate, which is formed outside the bottom of the deep trench). The structure is built up to this point is seen in FIG. 1 (Note that the buried plate and node dielectric are not shown in FIG. 1 since they are below the scale of interest in the figure). The deep trench poly 32, collar 20, buried strap polysilicon 105, trench-top oxide (TTO) 110, gate oxide 120 and gate poly 140 are all done by this time in conventional fashion well known to those skilled in the art. A poly stud and nitride spacer to make isolated contact to the cell transistor will be formed later. The energy of the Vt implant is chosen such that its peak (line 160) lies no deeper than one-third the distance from the N bitline diffusion 130 (i.e. the junction between the bitline and the channel) to the buried strap diffusion 107 (i.e. the corresponding channel-lower electrode junction) as seen in FIG. 3 (curve 364 ). For a current process having a nominal ground rule (typically the minimum active area feature (F) width) of 110 nm, the energy for peaking the dopant in the middle of the vertical gate at depth of 0.24 $\mu$m is 75 keV while the energy to peak it at 0.12 $\mu$m depth just below the As junction is 35–40 keV (both depths being referenced from the silicon surface). Processing, e.g. middle of the line and back end of the line, after this step is conventional and will be referred to collectively as "completing the circuit". Process steps involve completing the device including anneals that are typical and conventional.

Embodiment 2

In this embodiment the shallow threshold implant is done later than the first embodiment—after the processing of the support device regions outside the DRAM array. After the support devices are formed, the protective nitride covering over the array regions is removed, allowing the shallow threshold implant to be made into the array. Performing the shallow threshold implant at this point in the process allows the array channel doping profile to see fewer anneals and, therefore, the dose can be lowered if needed, particularly for controlling back-bias sensitivity effects.

Embodiment 3

In this embodiment, the shallow threshold implant is done after the bitline contact openings are formed (and through the openings), which is late in the process (after the gates of any horizontal transistors that may be in the circuit have been formed). This also reduces the number of anneals seen by the array MOSFET channel doping compared to the standard process of implanting after the gate poly is done; thus, the dose can be lowered if needed, particularly for controlling back-bias sensitivity effects. Further, in this case the junction capacitance is reduced.

The desensitization to rolloff provided according to the invention (by changing implant energy and dose) provides a greatly enlarged process window for the buried strap recess, resulting in much better short-channel roll-off behavior. The device complexities are quite difficult to understand and required a series of simulation and experimental studies to verify that changing the single parameter of threshold implant energy unexpectedly provided substantial improvement in both short channel effects and junction leakage, while at the same time preserving the other parameters mentioned above. Both the simulations and experiments confirm this unexpected result. It is readily integratable into this and other processes. Advantageously, since the only change is in the voltage of the implant, there is no cost impact whatsoever to controlling important device parameters according to the invention.

Those skilled in the art will readily appreciate that other embodiments of the invention may be made, with different implant energies dependent on the vertical dimensions of the transistors. Additionally, the invention is not confined to DRAMS, nor to silicon substrates. The silicon material 110 need not be in the form of a thin wafer, but may be one layer of a stack of semiconductor layers that contain a set of vertical transistors disposed in a set of layers disposed vertically above one another. Other circuits having vertical transistors may benefit from the invention, which may be practiced in Si—Ge, polysilicon or other semiconductor substrates. Other materials may be used for dielectrics and for gates according to the preference of the designer.

We claim:

1. A vertical transistor formed in a DRAM array in a semiconductor substrate comprising:

a trench extending vertically into said substrate and containing a transistor disposed above a capacitor;

an upper transistor electrode formed in a top level of said transistor;

a lower transistor electrode formed in a lower level of said transistor, the vertical distance between said upper transistor electrode and said lower transistor electrode being less than 200 nm;

a gate dielectric extending downwardly from said upper transistor electrode toward said lower transistor electrode and abutting a transistor body formed in said semiconductor substrate, said transistor body being disposed immediately adjacent to said lower electrode;

a threshold dopant distribution of dopant disposed in said transistor body, said dopant distribution having a maximum value of dopant concentration at a peak level closer to said upper transistor electrode than to said lower transistor electrode;

a transistor gate disposed in said trench adjacent said gate dielectric on a side opposite said transistor body; and an insulating plug disposed in said trench that separates said transistor gate and an inner electrode of said capacitor and that further defines the position of said lower transistor electrode, whereby the vertical position of said lower transistor electrode fluctuates in accordance with fluctuations in the vertical position of said insulating plug and in which said threshold dopant distribution has a concentration value that declines as a function of depth below said peak level, so that said concentration value of said threshold dopant distribution in said channel has a minimum value near said lower transistor electrode, and so that the threshold of said transistor is insensitive to said fluctuations in the position of said insulating plug.

2. A transistor according to claim 1, in which said threshold dopant distribution has a concentration value that declines as a function of depth below said peak level, whereby said concentration value of said threshold dopant distribution in said channel has a minimum value near said lower transistor electrode and thereby reduces leakage of stored charge.

3. A transistor according to claim 1, in which said maximum value of said dopant concentration is located at a distance below said upper transistor electrode that is no more than one third the total distance between said upper transistor electrode and said lower transistor electrode.

4. A transistor according to claim 2, in which said maximum value of said dopant concentration is located at a distance below said upper transistor electrode that is no more than one third the total distance between said upper transistor electrode and said lower transistor electrode.

5. A DRAM integrated circuit comprising an array of memory cells comprising a vertical transistor disposed above and connected to a capacitor, said vertical transistor extending downwardly from an upper transistor electrode toward a capacitor electrode and comprising:

a lower transistor electrode formed in a lower level of said transistor, the vertical distance between said upper transistor electrode and said lower transistor electrode being less than 200 nm;

a gate dielectric extending downwardly from said upper transistor electrode toward said lower transistor electrode and abutting a transistor body formed in said semiconductor substrate, said transistor body being disposed immediately adjacent to said lower electrode;

a threshold dopant distribution of dopant disposed in said transistor body, said dopant distribution having a maximum value of dopant concentration at a peak level closer to said upper transistor electrode than to said lower transistor electrode;

a transistor gate disposed in said trench adjacent said gate dielectric on a side opposite said transistor body; and an insulating plug disposed in said trench that separates said transistor gate and an inner electrode of said capacitor and that further defines the position of said lower transistor electrode, whereby the vertical position of said lower transistor electrode fluctuates in accordance with fluctuations in the vertical position of said insulating plug and in which said threshold dopant distribution has a concentration value that declines as a function of depth below said peak level, so that said concentration value of said threshold dopant distribution in said channel has a minimum value near said lower transistor electrode, and so that the threshold of said transistor is insensitive to said fluctuations in the position of said insulating plug.

6. A DRAM according to claim 5, in which said threshold dopant distribution has a concentration value that declines as a function of depth below said peak level, whereby said concentration value of said threshold dopant distribution in said channel has a minimum value near said lower transistor electrode and thereby reduces leakage of stored charge.

7. A DRAM according to claim 5, in which said maximum value of said dopant concentration is located at a distance below said upper transistor electrode that is no more than one third the total distance between said upper transistor electrode and said lower transistor electrode.

8. A DRAM according to claim 6, in which said maximum value of said dopant concentration is located at a distance below said upper transistor electrode that is no more than one third the total distance between said upper transistor electrode and said lower transistor electrode.

* * * * *